US011826873B2

(12) United States Patent
Venkatagiriyappa et al.

(10) Patent No.: US 11,826,873 B2
(45) Date of Patent: Nov. 28, 2023

(54) APPARATUS AND METHODS FOR SUSCEPTOR DEPOSITION MATERIAL REMOVAL

(71) Applicant: Applied Materials, Inc., Santa Clara, CA (US)

(72) Inventors: Vijayabhaskara Venkatagiriyappa, Bangalore (IN); Nitin Bhargav, San Jose, CA (US); Tae Kwang Lee, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 390 days.

(21) Appl. No.: 17/000,675

(22) Filed: Aug. 24, 2020

(65) Prior Publication Data

US 2022/0055179 A1   Feb. 24, 2022

(51) Int. Cl.
*B24B 37/04*   (2012.01)
*C23C 16/458*   (2006.01)
*B24B 37/20*   (2012.01)

(52) U.S. Cl.
CPC ............ *B24B 37/042* (2013.01); *B24B 37/20* (2013.01); *C23C 16/4583* (2013.01)

(58) Field of Classification Search
CPC .......... B24B 7/07; B24B 7/075; B24B 7/224; B24B 7/226; B24B 37/04; B24B 37/042; B24B 37/10; B24B 41/002; B24B 41/007; B24B 41/047; B24B 41/06; B24B 41/065; B24B 41/066; B24B 41/067; B24B 41/12; B24B 41/22; B24B 53/017; B24B 53/12; B24B 53/00–14; B24B 55/04

USPC ... 451/41, 59, 259, 278, 280, 281, 282, 294, 451/342, 343, 359, 361, 362, 444, 487
See application file for complete search history.

(56) References Cited

U.S. PATENT DOCUMENTS

| | | | | |
|---|---|---|---|---|
| 5,989,405 | A * | 11/1999 | Murata | C25D 15/02 205/110 |
| 6,464,574 | B1 * | 10/2002 | Halley | B24D 9/085 451/490 |
| 6,932,684 | B1 * | 8/2005 | Hunt | B24B 37/30 451/367 |
| 7,066,795 | B2 * | 6/2006 | Balagani | B24B 53/12 451/285 |
| 8,021,968 | B2 | 9/2011 | Nishizawa et al. | |
| 8,123,593 | B2 * | 2/2012 | Hoon | B24B 53/017 451/21 |
| 8,251,776 | B2 * | 8/2012 | Smith | B24B 53/017 451/10 |

(Continued)

FOREIGN PATENT DOCUMENTS

CN   110712104 A   *   1/2020   ......... B24B 27/0076

OTHER PUBLICATIONS

Machine translation of CN-110712104-A (Year: 2020).*

*Primary Examiner* — Joel D Crandall
*Assistant Examiner* — Robert F Neibaur
(74) *Attorney, Agent, or Firm* — Servilla Whitney LLC

(57) ABSTRACT

Apparatus and method for removing material from the susceptor of a batch processing chamber are described. The apparatus comprises a polishing tool including a rotatable platen positioned above the susceptor. A method comprises contacting material deposited on the susceptor with the rotatable platen to remove the material from the susceptor.

11 Claims, 9 Drawing Sheets

(56) References Cited

U.S. PATENT DOCUMENTS

| | | | |
|---|---|---|---|
| 8,641,476 B2* | 2/2014 | Duescher | ................ B24B 49/00 |
| | | | 451/6 |
| 10,262,888 B2 | 4/2019 | Gangakhedkar et al. | |
| 10,685,864 B2 | 6/2020 | Gangakhedkar et al. | |
| 11,440,155 B2* | 9/2022 | Fogelberg | ................ B24B 7/18 |
| 2019/0257000 A1 | 8/2019 | Myo et al. | |

* cited by examiner

APPARATUS AND METHODS FOR SUSCEPTOR DEPOSITION MATERIAL REMOVAL

TECHNICAL FIELD

The present disclosure relates generally to apparatus and methods for removing deposition material from a susceptor used in a substrate processing chamber. In particular, the disclosure relates to methods and apparatus for polishing deposition material from a portion of a susceptor.

BACKGROUND

Semiconductor device formation is commonly conducted in substrate processing systems or platforms containing multiple substrate processing chambers, which may also be referred to as cluster tools. In some instances, the purpose of a multi-chamber processing platform or cluster tool is to perform two or more processes on a substrate sequentially in a controlled environment. In other instances, however, a multiple chamber processing platform may only perform a single processing step on substrates. The additional chambers can be employed to maximize the rate at which substrates are processed. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for atomic layer deposition (ALD) processes and some chemical vapor deposition (CVD) processes.

Many high temperature CVD and ALD substrate processing chambers have smaller single wafer carriers which provide known film uniformity upon deposition. Providing thermal and film uniformity in a large carousel-type batch processing chamber which uses a multi-wafer carousel susceptor rotating about a center pedestal driven by a dual-axis motor is more challenging because the wafers are off-axis relative to the rotation of the susceptor. Non-uniform deposition of films in CVD substrate processing chambers and ALD substrate processing chambers on the susceptor can result in deposition non-uniformity on substrates processed in a chamber having non-uniform deposition on the susceptor. Non-uniform deposition in excess of 3% causes losses in product yield and requires the susceptor to be replaced. Currently, susceptors are cleaned using a wet cleaning process, which requires the susceptor to be removed from the substrate processing chamber. Removal of the susceptor from the substrate processing chamber is time-consuming, inefficient and does not result in optimal removal of material that tends to build up on the susceptor. Accordingly, there is a need to provide improved apparatus and methods to clean processing chamber susceptors having deposition material thereon.

SUMMARY

One or more embodiments of the disclosure are directed to an apparatus comprising a polishing tool including a rotatable platen having a first surface including an annular surface and a center, a drive shaft having a central axis coupled to the rotatable platen, and a motor coupled to the drive shaft, the motor configured to rotate the drive shaft and the rotatable platen about a rotation axis; an annular polishing pad removably fastened to an annular surface of the rotatable platen, the annular polishing pad configured to polish an annular surface of a substrate processing chamber susceptor; and a mounting element configured to mount the polishing tool above the substrate processing chamber susceptor.

Additional embodiments of the disclosure are directed to an apparatus for removing material from a susceptor of a substrate processing chamber. In one embodiment, the apparatus comprises a polishing tool including a rotatable platen having a first surface including an annular surface and a center, a drive shaft having a central axis coupled to the rotatable platen, and a motor coupled to the drive shaft, the motor configured to rotate the drive shaft and the rotatable platen about a rotation axis; an annular polishing pad removably fastened to an annular surface of the rotatable platen, the annular polishing pad configured to polish an annular surface of a substrate processing chamber susceptor; a mounting element configured to mount the polishing tool above the substrate susceptor; and a platen housing surrounding the rotatable platen, the platen housing comprising at least one port coupled to a suction system configured to remove dust through at least one platen opening.

Further embodiments of the disclosure are directed to processing methods. An embodiment comprises a method of removing deposited material from a susceptor in a processing chamber, the method comprising positioning a polishing tool including a rotatable platen including an annular surface and an annular polishing pad removably fastened to the annular surface of the rotatable platen over the susceptor having material deposited thereon; rotating the rotatable platen; and contacting material deposited on the susceptor with the rotatable platen to remove the material from the susceptor

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Figure 1:
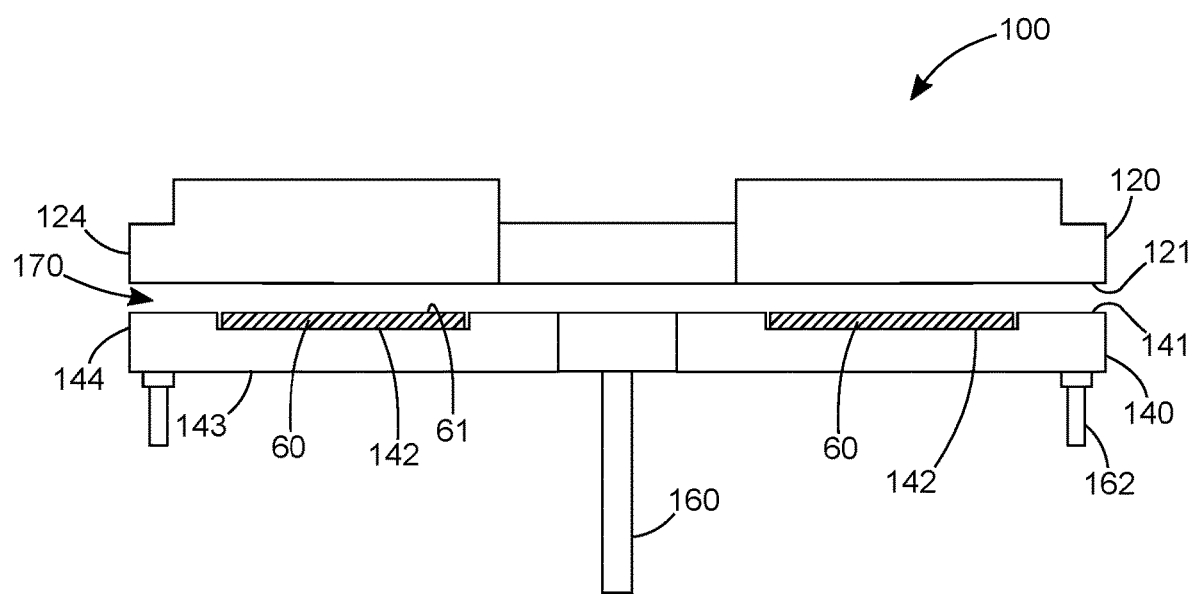
FIG. 1 shows a cross-sectional view of a batch processing chamber according to one or more embodiments of the disclosure.

FIG. 1 shows a cross-section of a substrate processing chamber 100 including a gas distribution assembly 120, also referred to as injectors or an injector assembly, and a susceptor 140. The gas distribution assembly 120 is any type of gas delivery device used in a substrate processing chamber. The gas distribution assembly 120 includes a front surface 121 which faces the susceptor 140. The front surface 121 can have any number or variety of openings to deliver a flow of gases toward the susceptor 140. The gas distribution assembly 120 also includes an outer peripheral edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial gas distribution assemblies which have a plurality of substantially parallel gas channels.

In some embodiments, the gas distribution assembly 120 is a rigid stationary body made of a single injector unit. In one or more embodiments, the gas distribution assembly 120 is made up of a plurality of individual sectors (e.g., injector units). Either a single piece body or a multi-sector body can be used with the various embodiments of the disclosure described.

As shown in FIG. 1, the susceptor 140 is positioned beneath the gas distribution assembly 120. The susceptor 140 includes a top surface 141 and at least one recess 142 in the top surface 141. The susceptor 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor are coplanar within ±0.2 mm. In some embodiments, the top surfaces are coplanar within ±0.15 mm, ±0.10 mm or ±0.05 mm.

The susceptor 140 of FIG. 1 includes a support post 160 which is capable of lifting, lowering and rotating the susceptor 140. The susceptor may include a heater, or gas lines, or electrical components within the center of the support post 160. The support post 160 may be the primary means of increasing or decreasing the gap between the susceptor 140 and the gas distribution assembly 120, moving the susceptor 140 into proper position. The susceptor 140 may also include fine tuning actuators 162 which can make micro-adjustments to susceptor 140 to create a predetermined gap 170 between the susceptor 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

Figure 2:
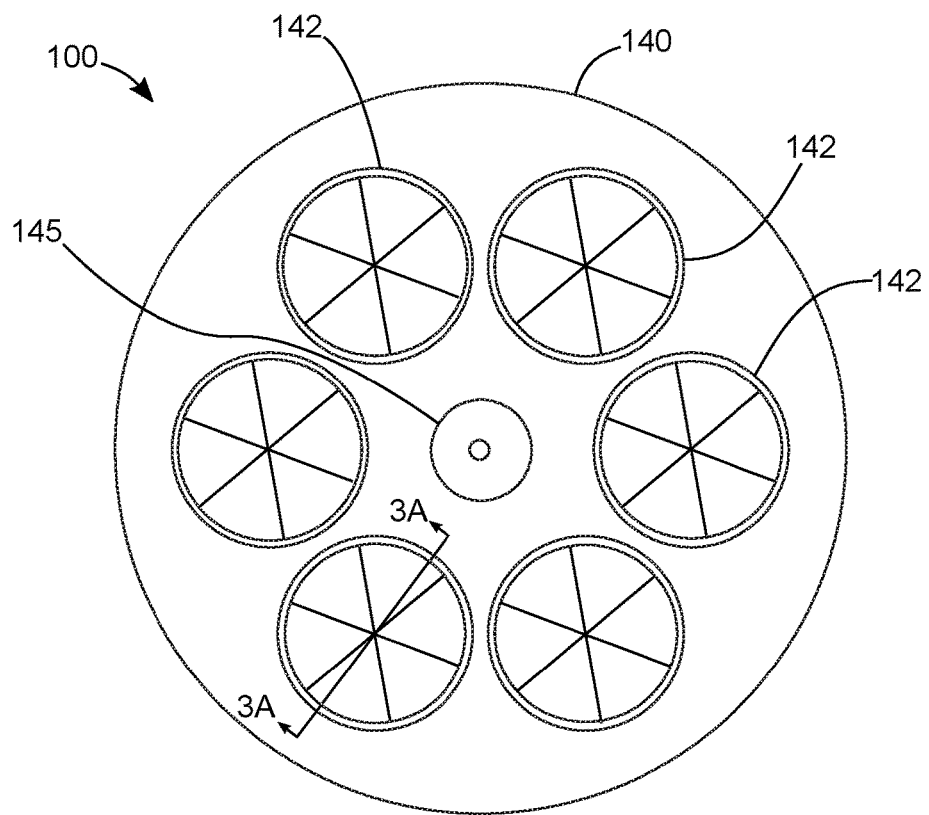
FIG. 2 shows a top plan view of a susceptor according to one or more embodiments of the disclosure.

Referring to FIG. 2, which shows a top view of the susceptor 140 of the substrate processing chamber 100, which is a carousel-type substrate processing chamber in which the susceptor 140 includes a plurality of recesses 142 which can hold a plurality of substrates 60. As shown in FIG. 2, the susceptor comprises a central region 145, and six recesses 142 are peripherally spaced around the central region 145. The susceptor can comprise any number of recesses 142. In one embodiment, there is a single recess, in other embodiments, the suspector assembly can include two, three, four, five, six, seven, eight, nine, or ten or more recesses 142. Processing chambers having multiple gas injectors can be used to process multiple wafers simultaneously so that the wafers experience the same process flow.

Figure 3A:
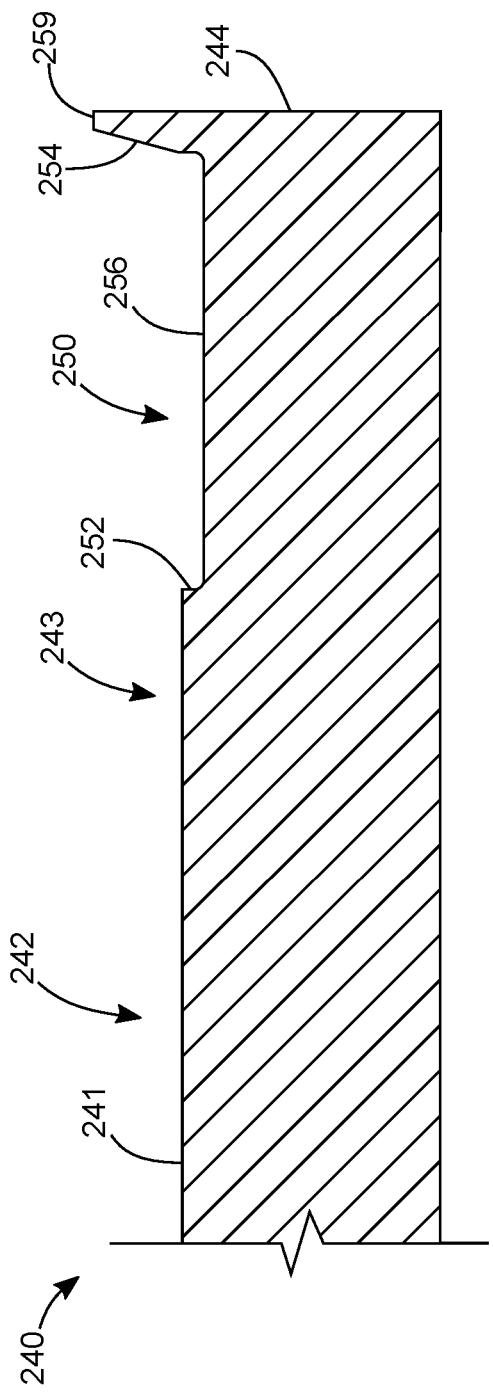
FIG. 3A shows a partial cross-sectional view taken along line 3A of FIG. 2.
Figure 3B:
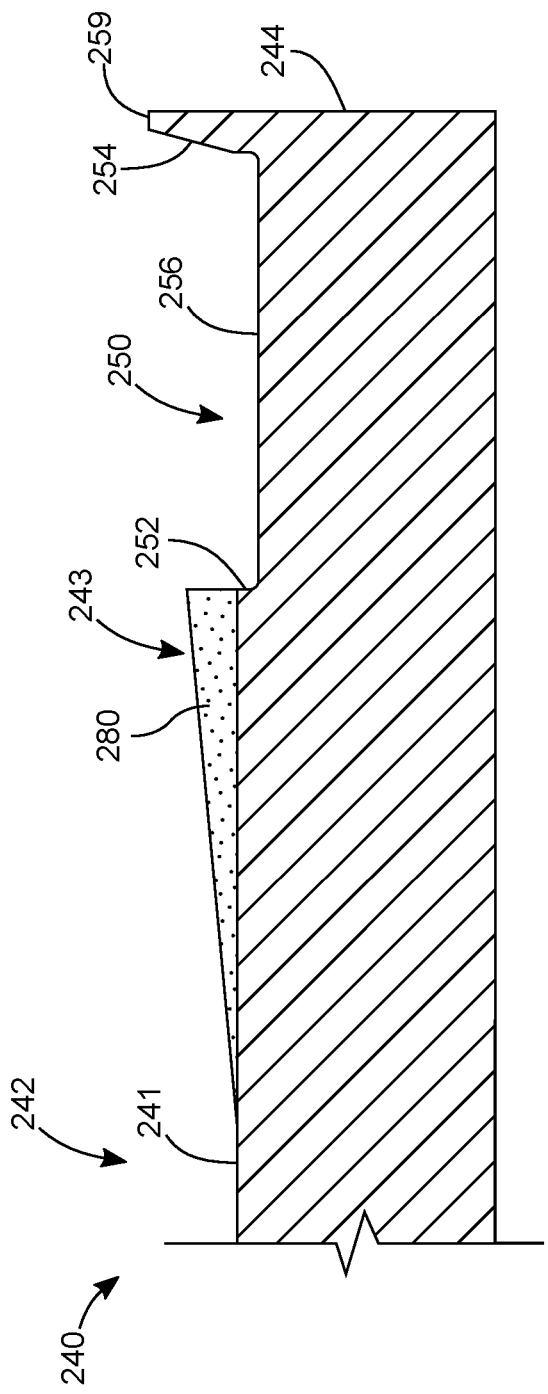
FIG. 3B shows the partial cross-sectional view of a susceptor having material deposited on a surface of the susceptor.
Figure 4:
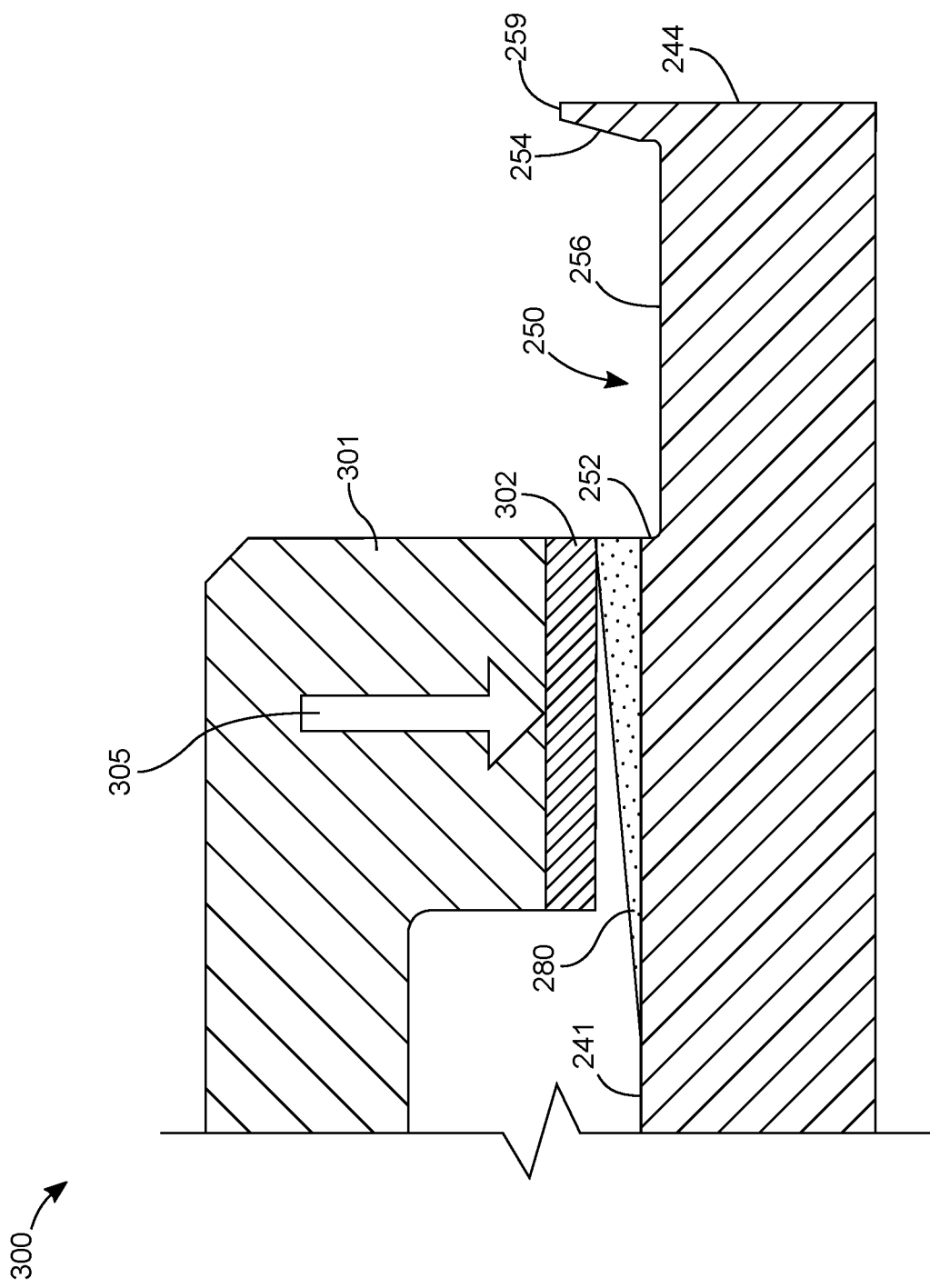
FIG. 4 shows a partial cross-sectional view of polishing apparatus and the susceptor having material deposited on a surface of the susceptor according to one or more embodiments of the disclosure.
Figure 5:
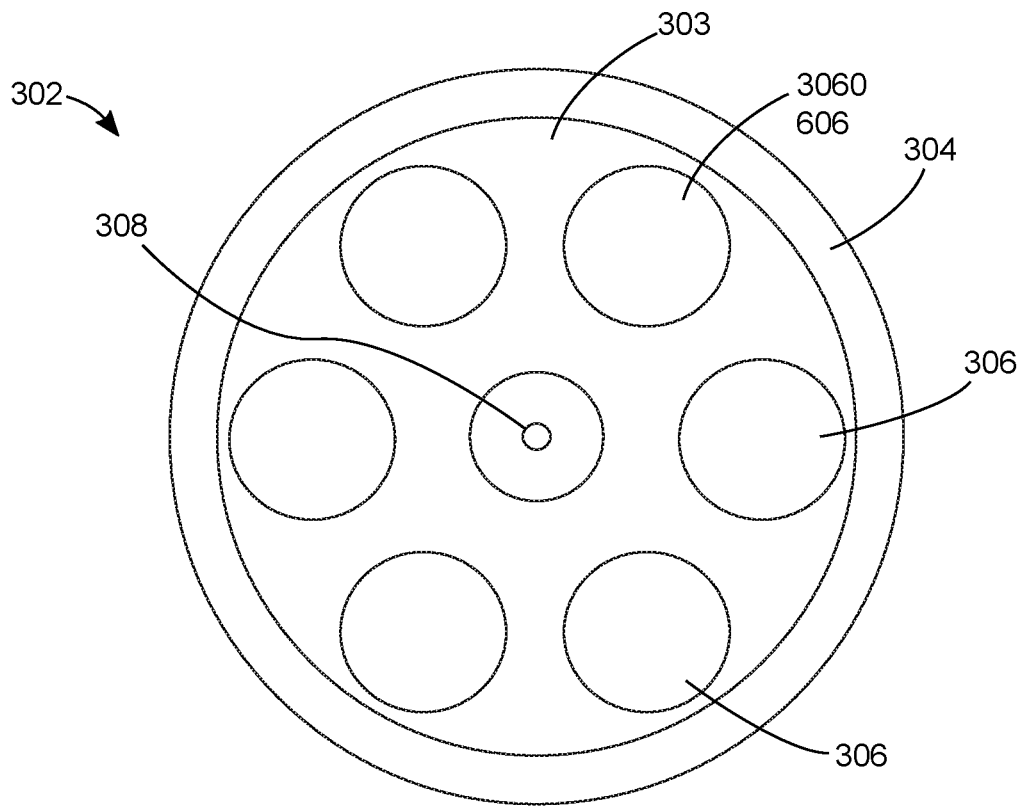
FIG. 5 shows a bottom view of a portion of a polishing apparatus according to one or more embodiments of the disclosure.
Figure 6:
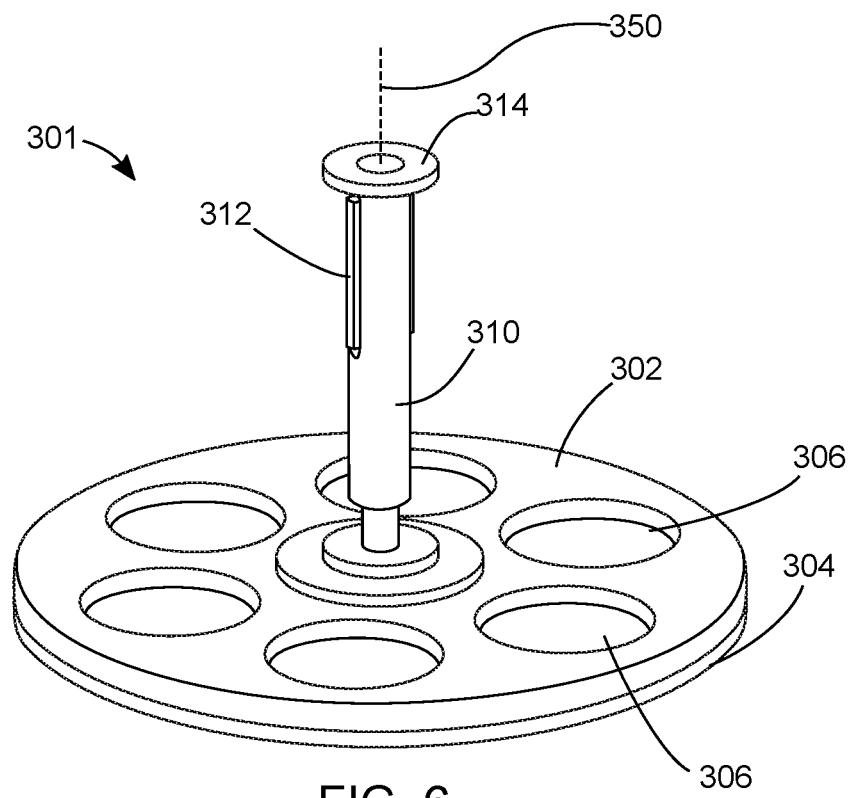
FIG. 6 shows a perspective view of a portion of a polishing apparatus according to one or more embodiments of the disclosure.

Referring now to FIGS. 3A and 3B, a portion of a susceptor 240 is shown according to an embodiment of the disclosure. The susceptor 240 includes a top surface 241 located in a central portion 242 of the susceptor 240 and a peripheral pocket 250 located between a peripheral edge 244 and the central portion 242 of the susceptor 240. The peripheral pocket 250 comprises a recessed surface 256, which is below the top surface 241, an inner edge 252 and an outer edge having a top edge surface 259. Referring now specifically to FIG. 3B, the susceptor 240 of FIG. 3A is shown with deposited material 280 thereon. As shown in FIG. 3B, the deposition material 280 is non-uniform in thickness, and the deposited material 280 deposited on the susceptor is thicker at the location closest to the inner edge 252 of the pocket 250 than closer to the central portion 242 of the susceptor 240. In one or more embodiments, the deposited material 280 is particulate material deposited during an ALD process or a CVD process that has been performed in substrate processing chamber. The material 280 is material that has not been deposited on a substrate 60 that has been processed in the chamber, but is deposited on at least a portion of the susceptor. As shown in FIG. 4, the material 280 is on an annular surface 243 between the central portion 242 and the pocket 250.

As discussed above, non-uniform deposition of films in chemical vapor deposition (CVD) substrate processing chambers and atomic layer deposition (ALD) substrate processing chambers on the susceptor can result in non-uniform deposition on substrates processed in a chamber having non-uniform deposition on the susceptor. When deposition non-uniformity is greater than 3%, unacceptably high loss of product yield occurs. An existing susceptor cleaning method involves immersing the susceptor in chemical bath followed by an extensive drying process to remove the deposition material 280 deposited on the susceptor. This process involves about two weeks of time and can cost several thousand dollars. According to one or more embodiments of the disclosure, methods and apparatus are provided which solve the problem in a much less expensive and less time-consuming manner.

According to one or more embodiments, methods and apparatus are provided which reduce the deposition non-uniformity on the susceptor, and increases the life cycle of susceptors used in CVD and ALD substrate processing chambers. In specific embodiments, the methods and apparatus polish SiN material from a suspector of an ALD substrate processing chamber or a CVD substrate processing chamber. Advantageously, the method and apparatus described herein permit material deposited on the susceptor faster than existing methods without removing the susceptor from the substrate processing chamber.

Embodiments of the disclosure pertain to apparatus and methods for removing deposited material from a susceptor of a substrate processing chamber. FIG. 4 shows a schematic of an apparatus comprising a polishing tool 301 including a rotatable platen 302 which exerts downward pressure shown by arrow 305 on deposited material on a susceptor.

Referring now to FIGS. 5-10, the polishing tool 301 includes a rotatable platen 302 having a first surface 303 including an annular surface 304 and a center 308, a drive shaft 310 having a rotation axis 350, the drive shaft 310 coupled to the rotatable platen 302. The drive shaft 310 may have a coupler 314 on one end to affix or couple the drive shaft to a motor 330. The motor 330 is coupled to the drive shaft 310, and the motor 330 configured to rotate the drive shaft 310 and the rotatable platen 320 about the rotation axis 350. The drive shaft 310 may further include a shaft lock key 312, which provides for secure mounting of the drive shaft 310 to the motor. The polishing tool 301 further includes an annular polishing pad 349 removably fastened to the annular surface 304 of the rotatable platen 302. The annular polishing pad 349 is configured to polish an annular surface of the substrate processing chamber susceptor 240. The apparatus 300 further comprises a mounting element 360 configured to mount the polishing tool 301 above the susceptor 240.

In the embodiment shown, the rotatable platen 302 has at least one platen opening 306 therethrough. In one or more embodiments, the at least one platen opening 306 is located between the center 308 of the rotatable platen 302 and the annular surface 304. In specific embodiments, there is a plurality of platen openings 306 through the rotatable platen 302. In one or more embodiments, the plurality of platen openings 306 is located between the center 308 of the rotatable platen 302 and the annular surface 304.

Figure 7:
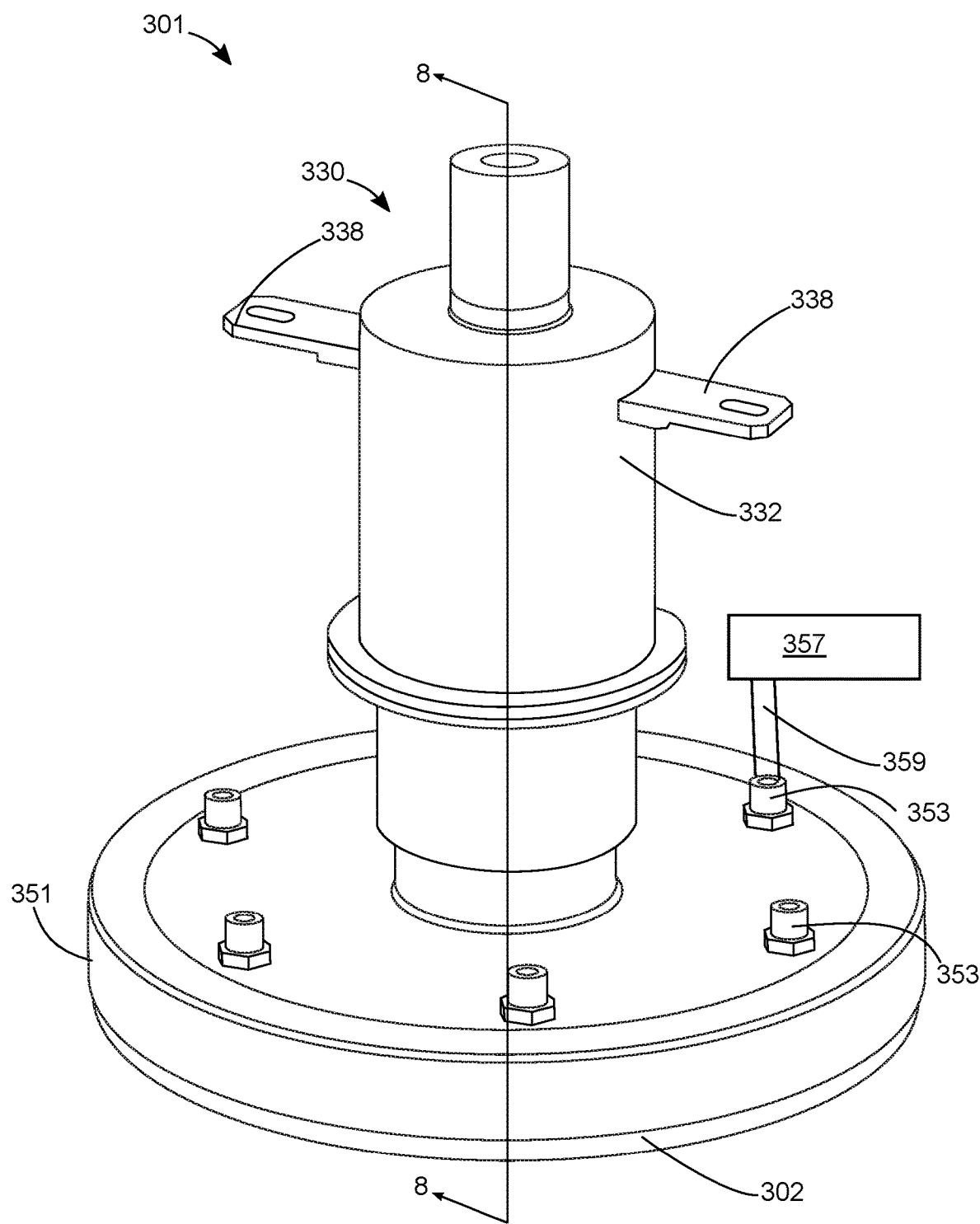
FIG. 7 shows a perspective view of a polishing apparatus according to one or more embodiments of the disclosure.
Figure 8:
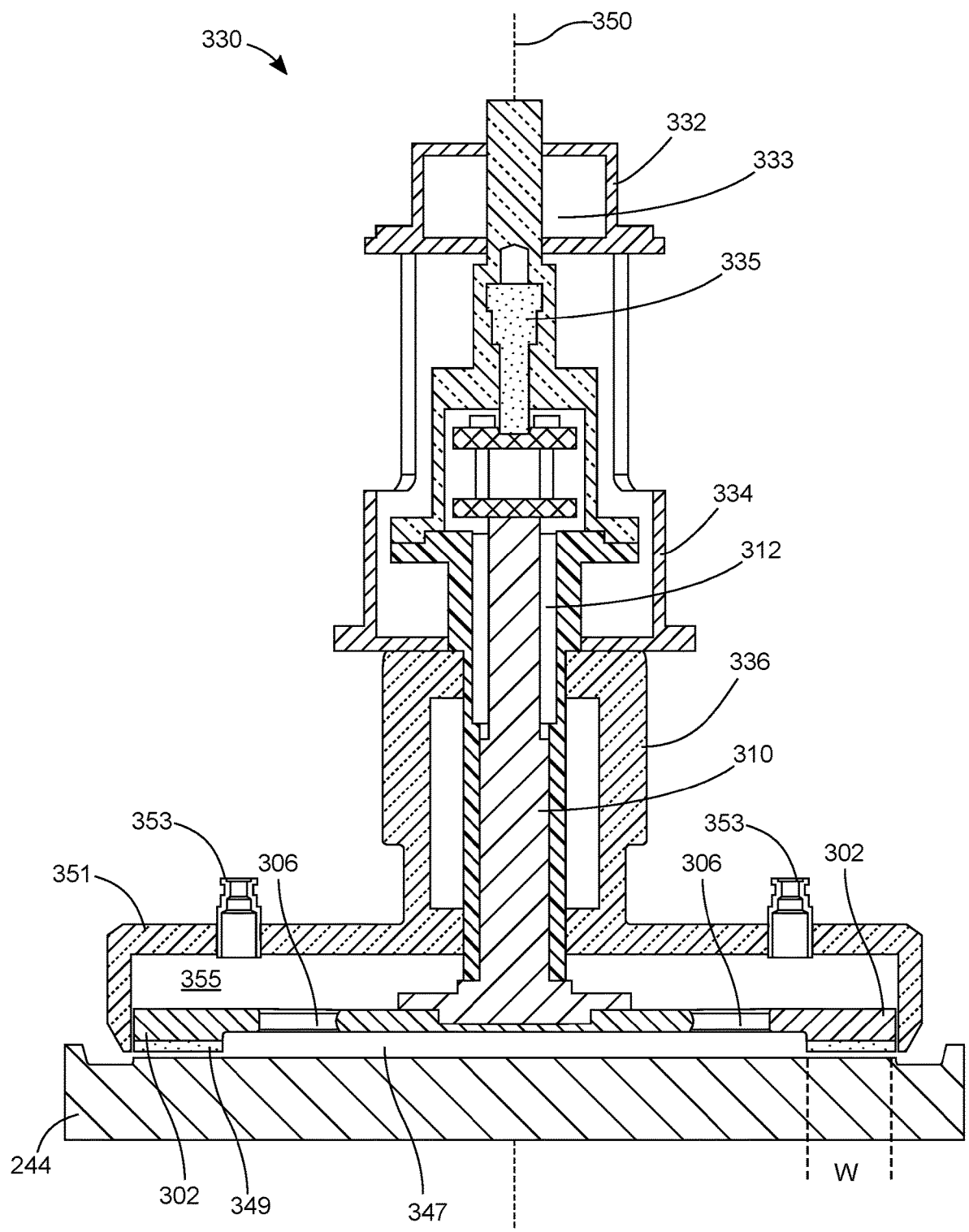
FIG. 8 shows a cross-sectional view of the polishing apparatus showing in FIG. 7, taken along line 8-8.

Referring now to FIGS. 7 and 8, in one or more embodiments, the motor 330 comprises a motor housing 332, which can house a rotary actuator 333, for example, a servo motor, which is coupled to the drive shaft 310. In some embodiments, the rotary actuator 333 is coupled to the drive shaft 310 by a coupling screw 335. In some embodiments, the motor housing 332 includes extensions 338, which can be mounted to a mounting element described further herein. The motor 330 of some embodiments further comprises an intermediate housing 334 and a shaft housing 336, which houses the drive shaft 310. It will be understood that configuration of the motor 330 is not limited to the configuration shown in FIGS. 7 and 8. In some embodiments, a servo motor with a semiconductor compatible gear box is mounted coupled to the drive shaft 310 to provide required drive torque to rotatable platen 302 to remove material from a susceptor of a substrate processing chamber.

Figure 9:
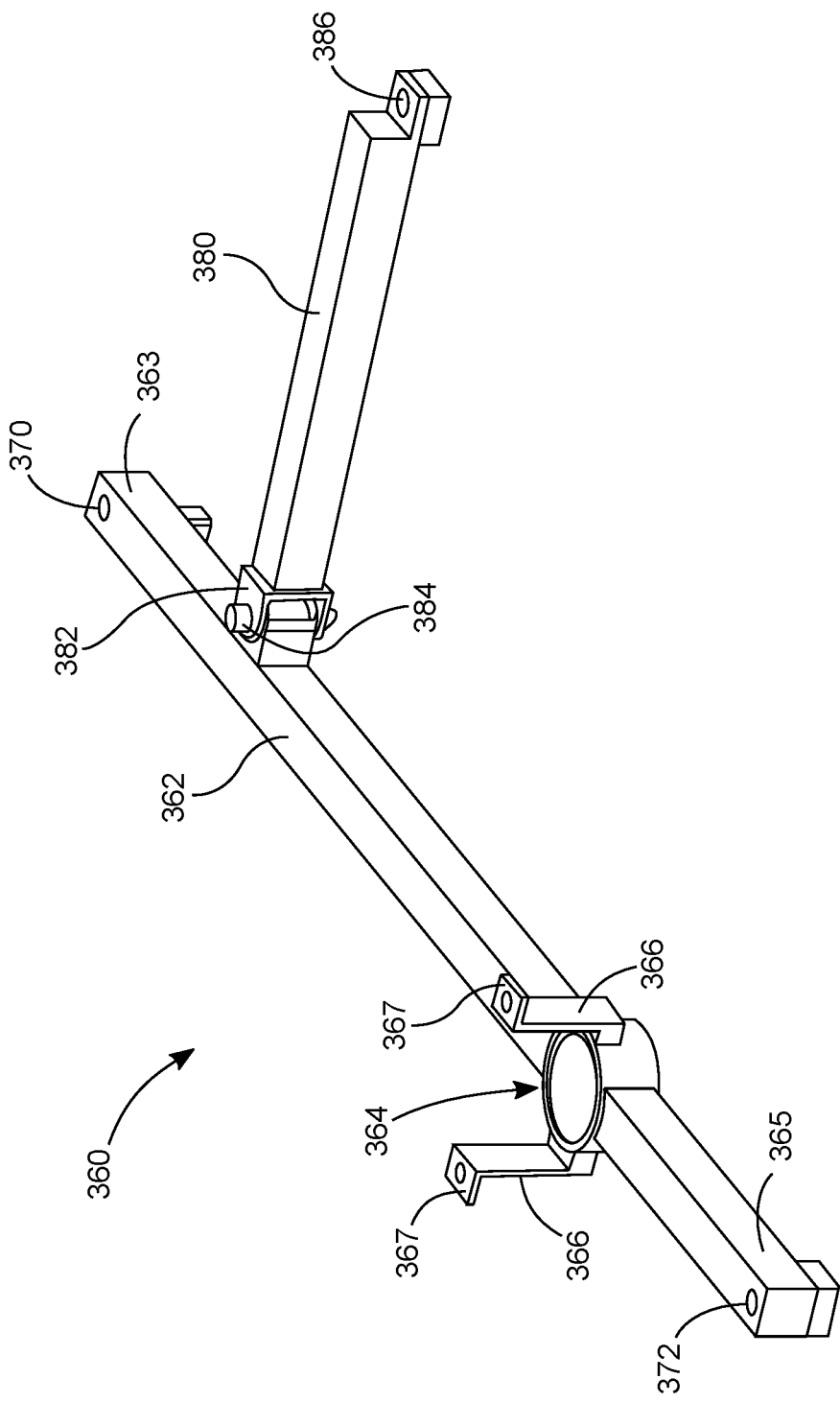
FIG. 9 shows a perspective view of a mounting element for a polishing apparatus according to one or more embodiments of the disclosure.
Figure 10:
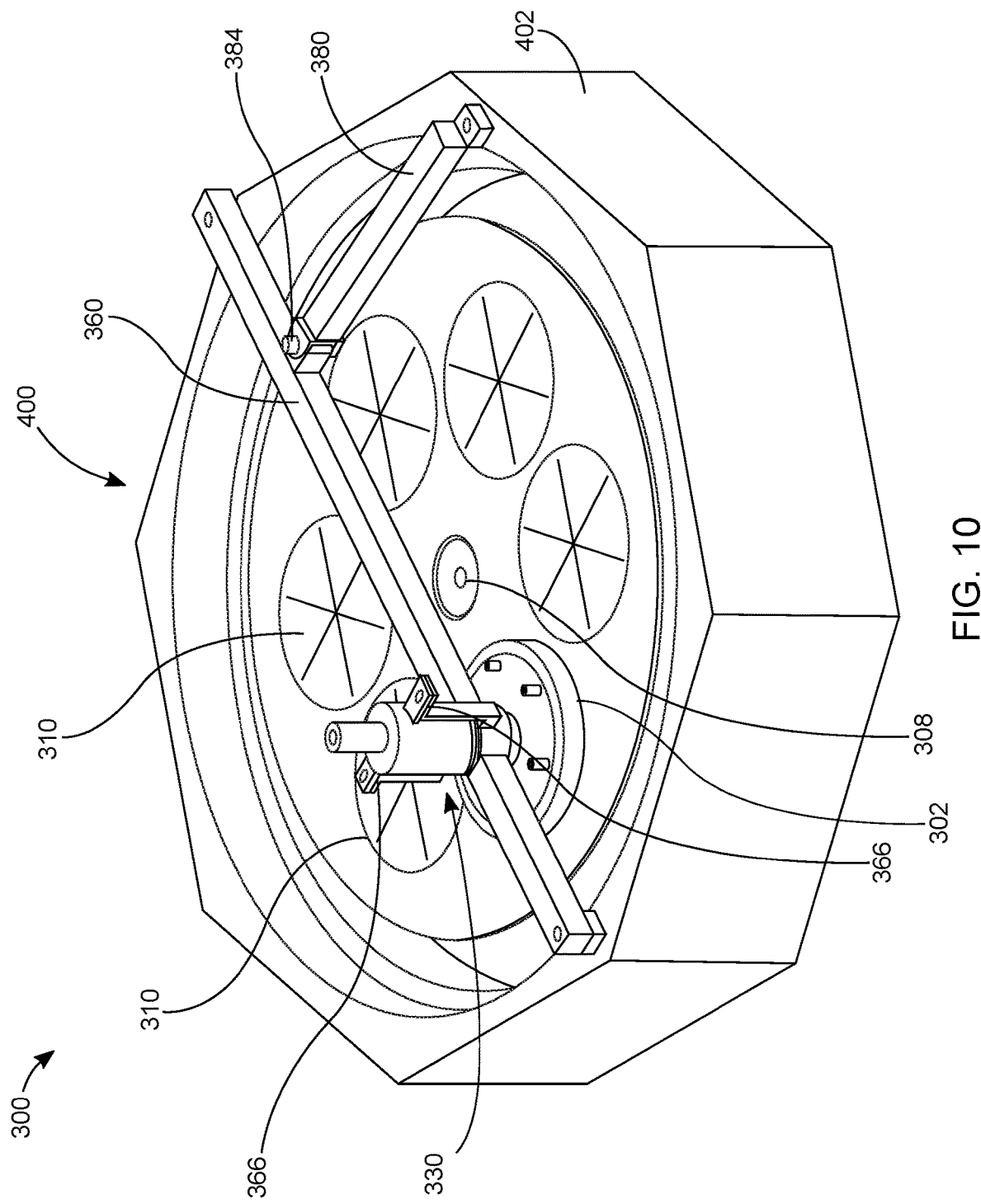
FIG. 10 shows a perspective view of a polishing apparatus mounted to a substrate processing chamber according to one or more embodiments of the disclosure.

Referring now to FIG. 9 the apparatus 300 according to one or more embodiments comprises a mounting element 360 including a first arm 362 having a first end 363 and a second end 365. In the embodiment shown, there is a mounting fixture including a sleeve 364 positioned between the first end 363 and the second end 365. The sleeve 364 is sized to receive the motor 330 in the sleeve 364 and to position the rotatable platen 302 over the substrate processing chamber susceptor 240. The mounting element 360 is configured to be assembled to a substrate processing chamber 400 as shown in FIG. 10. The mounting element 360 may further comprise a bracket including spaced apart arms 366 including mounting tabs 367, which may be used to secure the motor 330 to the arms 366 by fasteners (not show) such as screws or bolts. In specific embodiments, the extensions 338 from the motor housing engage the arms 366 to secure the motor 330 to the mounting element 360. The mounting element 360 may further comprise a first aperture 370 at the first end 363 and a second aperture 372 at the second end 365. The first aperture 370 and the second aperture 372 in some embodiments are each configured to receive a fastener such as a bolt or a screw to secure the mounting element 360 to a substrate processing chamber 400, for example, a chamber body 402 of the substrate processing chamber 400.

In some embodiments, the mounting element 360 includes a second arm 380 pivotally attached to the first arm 362 by a hitch 382 and a pin 384. A third aperture 386 may be used to mount the second arm to a substrate processing chamber body as shown in FIG. 10.

According to one or more embodiments, the annular polishing pad 349 comprises a diamond pad having hardness configured to remove a silicon nitride coating from substrate processing chamber susceptor made from graphite. In some embodiments, the susceptor is made from quartz. In one or more embodiments, the diamond pad is a resin bonded diamond pad. In one or more embodiments, the annular polishing pad 349 comprises a central void space 347 and an annular width W of at least 10 mm.

One or more embodiments of the apparatus comprise a platen housing 351 surrounding the rotatable platen 302, the platen housing 351 comprising at least one port 353 coupled to a vacuum system 357 configured to remove dust through the at least one platen opening 306. In specific embodiments, dust formed by the annular polishing pad 349 on the rotatable platen 302 contacting the material 280 deposited on the susceptor is drawn through the at least one of the plurality of platen openings 306 into the open space 355 formed between the platen housing 351 and the rotatable platen 302 by the vacuum system 357 connected to the at least one port 353. While FIG. 7 shows the vacuum system 357 coupled to one port 353 by conduit 359, it will be understood that each of the at least one ports 353 are coupled to the vacuum system 357 to remove material suctioned through the at least one platen opening 306 in the rotatable platen 302.

In one or more embodiments, an apparatus 300 for removing material from a susceptor 240 of a substrate processing chamber the apparatus comprises the polishing tool 301 including a rotatable platen 302 having the first surface including the annular surface 304 and the center 308, the drive shaft 310 having the central axis coupled to the rotatable platen 302, and the motor 330 coupled to the drive shaft 310. The motor 330 is configured to rotate the drive shaft and the rotatable platen about the rotation axis 350. The annular polishing pad 349 is removably fastened to an annular surface 304 of the rotatable platen, and the annular polishing pad 349 is configured to polish an annular surface of a substrate processing chamber susceptor 240. The mounting element 360 is configured to mount the polishing tool 301 above the substrate processing chamber susceptor 240. The platen housing 351 surrounds the rotatable platen 302, and the platen housing comprises at least one port 353 coupled to a suction system such as a vacuum system 357 configured to remove dust through the at least one platen opening 306. In some embodiments, filters are provided to filter the dust in entering the vacuum system 357. According to some embodiments, the vacuum system 357 not only removes the particles/dust that is generated by the rotatable platen and the annular polishing pad, but also seals the dust to spread out of the diamond pad housing and deposit on the other part of the susceptor and remove the heat generated in the annular polishing pad. Advantageously, this ensures contamination of the substrate processing chamber is avoided and particle count inside the substrate processing chamber is within an acceptable specified value to prevent particulate contamination of substrates processed in the substrate processing chamber.

Figure 11:
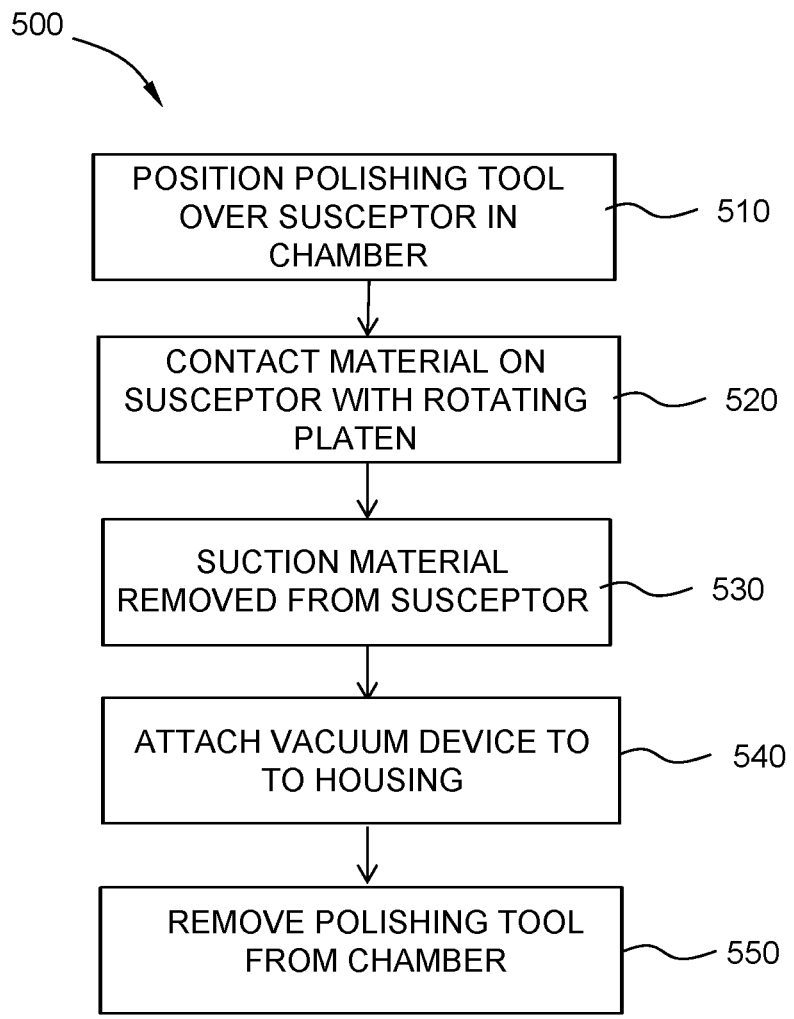
FIG. 11 is a flowchart illustrating a method of removing material deposited on a susceptor in a substrate processing chamber according to an embodiment of the disclosure.

With reference to FIG. 11, another aspect of the disclosure pertains to a method 500 of removing deposited material from a susceptor in a substrate processing chamber. The method 500 according to one or more embodiments comprises at 510 positioning a polishing tool including a rotatable platen including an annular surface and an annular polishing pad removably fastened to the annular surface of the rotatable platen over the susceptor having material deposited thereon. At 520 the rotatable platen is rotated and material deposited on the susceptor is contacted with the rotatable platen to remove the material from the susceptor.

In some embodiments, positioning the polishing tool comprises mounting the polishing tool to the substrate processing chamber. In some embodiments, mounting the polishing tool to the substrate processing chamber comprises assembling a mounting element to the substrate processing chamber, the mounting element including a first arm having a first end and a second end and a mounting fixture positioned between the first end and the second end.

In some embodiments of the method, the polishing tool includes the rotatable platen having a first surface including an annular surface and a center, and the polishing tool further comprises a drive shaft having a central axis coupled to the rotatable platen, and a motor coupled to the drive shaft, the motor configured to rotate the drive shaft and the rotatable platen about a rotation axis.

Some embodiments of the method further comprises mounting the polishing tool to the mounting fixture. In some embodiments, the method at 530 comprises suctioning material removed from the susceptor through at least one platen opening in the rotatable platen. The method further comprises at 540 attaching a vacuum device to a housing attached to the rotatable platen. At 550, the polishing tool is removed from the substrate processing chamber According to one or more embodiments, the substrate processing chamber may be part of a substrate processing apparatus comprising multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, annealing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, anneal, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the substrate processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the substrate processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge the excess reagent out of the chamber before flowing in additional regent. Therefore, any leftover reagent in the chamber may react. With spatial separation, excess reagent does not need to be purged, and cross-contamination is limited. Furthermore, a lot of time can be used to purge a chamber, and therefore throughput can be increased by eliminating the purge step.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. An apparatus comprising:
a polishing tool including a rotatable platen having a first surface including an annular surface, a center and at least one platen opening, a drive shaft having a central axis coupled to the rotatable platen, and a motor coupled to the drive shaft, the motor configured to rotate the drive shaft and the rotatable platen about a rotation axis;
an annular polishing pad removably fastened to the annular surface of the rotatable platen and surrounding a central void space, the annular polishing pad configured to polish and remove non-uniformly deposited material from a vapor deposition substrate processing chamber susceptor comprising a peripheral pocket spaced from a central region of the susceptor and defining an annular surface adjacent to an inner edge of the peripheral pocket, the annular surface extending toward the central region and the non-uniformly deposited material is thicker adjacent to the inner edge than closer to the central region;
a platen housing surrounding the rotatable platen defining an open space between the platen housing and the rotatable platen, the platen housing comprising at least one port coupled to a vacuum system configured to remove dust through the at least one platen opening in communication with the open space and the central void space; and
a mounting element configured to mount the polishing tool above the vapor deposition substrate processing chamber susceptor to remove the non-uniformly deposited material from the annular surface of the susceptor without removing the susceptor from the vapor deposition substrate processing chamber.

2. The apparatus of claim 1, wherein the rotatable platen comprises a plurality of platen openings therethough.

3. The apparatus of claim 1, wherein the at least one platen opening is located between the center of the rotatable platen and the annular surface.

4. The apparatus of claim 2, wherein the plurality of platen openings is located between the center of the rotatable platen and the annular surface of the rotatable platen.

5. The apparatus of claim 1, wherein the annular polishing pad comprises a diamond pad having hardness configured to remove a silicon nitride coating from the vapor deposition substrate processing chamber susceptor.

6. The apparatus of claim 5, wherein the diamond pad is a resin bonded diamond pad.

7. The apparatus of claim 1, wherein the annular polishing pad comprises a central void space and a width of at least 10 mm.

8. The apparatus of claim 1, wherein the motor comprises a servo motor.

9. The apparatus of claim 1, wherein the mounting element comprises a first arm having a first end and a second end and a mounting fixture positioned between the first end and the second end, the mounting element configured to be assembled to a substrate processing chamber.

10. The apparatus of claim 9, wherein the mounting fixture comprises a sleeve sized to receive the motor in the sleeve and to position the rotatable platen over the substrate processing chamber susceptor.

11. An apparatus for removing material from a susceptor of a substrate processing chamber the apparatus comprising:
a polishing tool including a rotatable platen having a first surface including an annular surface, a center and at least one platen opening, a drive shaft having a central axis coupled to the rotatable platen, and a motor coupled to the drive shaft, the motor configured to rotate the drive shaft and the rotatable platen about a rotation axis;
an annular polishing pad removably fastened to the annular surface of the rotatable platen and surrounding a central void space, the annular polishing pad configured to polish and remove non-uniformly deposited material from a vapor deposition substrate processing chamber susceptor comprising a peripheral pocket spaced from a central region of the susceptor and defining an annular surface adjacent to an inner edge of the peripheral pocket, the annular surface extending toward a central region and the non-uniformly deposited material is thicker adjacent to the inner edge than closer to the central region;
a platen housing surrounding the rotatable platen defining an open space between the platen housing and the rotatable platen, the platen housing comprising at least one port coupled to a vacuum system configured to remove dust through the at least one platen opening in communication with the open space and the central void space; and
a mounting element comprising a first arm, a sleeve sized to receive a motor, and a second arm pivotally attached to the first arm and configured to mount the polishing tool above the vapor deposition substrate processing chamber susceptor to remove the non-uniformly deposited material from the annular surface of the susceptor without removing the susceptor from the vapor deposition substrate processing chamber.

* * * * *